United States Patent
Yoshizaki et al.

(10) Patent No.: US 11,643,573 B2
(45) Date of Patent: May 9, 2023

(54) POLISHING COMPOSITION, PRODUCTION METHOD THEREFOR, AND POLISHING METHOD AND PRODUCTION METHOD FOR SUBSTRATE, USING POLISHING COMPOSITION

(71) Applicant: FUJIMI INCORPORATED, Kiyosu (JP)

(72) Inventors: Yukinobu Yoshizaki, Kiyosu (JP); Koichi Sakabe, Kiyosu (JP); Satoru Yarita, Kiyosu (JP); Kenichi Komoto, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 23 days.

(21) Appl. No.: 16/492,835

(22) PCT Filed: Jan. 23, 2018

(86) PCT No.: PCT/JP2018/001952
§ 371 (c)(1),
(2) Date: Sep. 10, 2019

(87) PCT Pub. No.: WO2018/168206
PCT Pub. Date: Sep. 20, 2018

(65) Prior Publication Data
US 2021/0139739 A1 May 13, 2021

(30) Foreign Application Priority Data
Mar. 14, 2017 (JP) .............................. JP2017-048626

(51) Int. Cl.
*C09G 1/02* (2006.01)
(52) U.S. Cl.
CPC ...................................... *C09G 1/02* (2013.01)
(58) Field of Classification Search
None
See application file for complete search history.

(56) References Cited

U.S. PATENT DOCUMENTS

| | | | |
|---|---|---|---|
| 2003/0124959 A1 | 7/2003 | Schroeder et al. | |
| 2004/0248412 A1* | 12/2004 | Liu ........................ | B23H 3/08 438/689 |
| 2006/0030158 A1* | 2/2006 | Carter .................. | C09K 3/1463 438/692 |
| 2007/0044386 A1 | 3/2007 | Yamaguchi | |
| 2007/0181534 A1 | 8/2007 | Kamimura | |
| 2008/0087644 A1* | 4/2008 | Nishioka ........... | H01L 21/31053 216/89 |
| 2010/0301014 A1 | 12/2010 | Mizuno et al. | |
| 2011/0155690 A1 | 6/2011 | Yamaguchi | |
| 2011/0183581 A1 | 7/2011 | Otsu et al. | |
| 2011/0240594 A1 | 10/2011 | Hamaguchi et al. | |
| 2012/0225555 A1 | 9/2012 | Lakrout | |
| 2012/0225556 A1 | 9/2012 | Lakrout et al. | |
| 2013/0032571 A1 | 2/2013 | Doi et al. | |
| 2013/0146804 A1 | 6/2013 | Mizuno | |
| 2013/0309946 A1 | 11/2013 | Hamaguchi | |
| 2014/0001155 A1 | 1/2014 | Hamaguchi | |
| 2014/0094033 A1 | 4/2014 | Yamato et al. | |
| 2015/0218709 A1* | 8/2015 | Yoshizaki ......... | H01L 21/30625 252/79.2 |
| 2016/0001416 A1* | 1/2016 | Tsuchiya ........... | H01L 21/30625 451/41 |
| 2016/0107289 A1* | 4/2016 | Cavanaugh .............. | C09D 5/08 216/53 |
| 2016/0108284 A1* | 4/2016 | Yoshizaki ................ | C09G 1/00 252/79.1 |
| 2016/0358790 A1 | 12/2016 | Shi et al. | |
| 2017/0136600 A1 | 5/2017 | Shinoda | |
| 2017/0275498 A1* | 9/2017 | Tamada ............... | C09K 3/1463 |
| 2018/0002571 A1* | 1/2018 | Stender ................. | B24B 37/044 |
| 2021/0130749 A1* | 5/2021 | Sakanishi ........... | C11D 11/0047 |

FOREIGN PATENT DOCUMENTS

| | | |
|---|---|---|
| CN | 102690609 A | 9/2012 |
| CN | 102858494 A | 1/2013 |
| CN | 103620747 A | 3/2014 |
| JP | 2004-179294 A | 6/2004 |
| JP | 2004-231748 A | 8/2004 |
| JP | 2005-513765 A | 5/2005 |
| JP | 2005-285944 A | 10/2005 |

(Continued)

OTHER PUBLICATIONS

Office Action issued in corresponding Chinese Patent Application No. 201880018195.9 dated Jun. 1, 2021 with English translation.
Office Action issued in corresponding Taiwanese Patent Application No. 107103981 dated Jul. 12, 2021 with English translation.
Office Action issued in corresponding Chinese Application No. 201880018195. 9 dated Sep. 2, 2020 with English translation.
Office Action issued in corresponding Chinese Patent Application No. 2021112502477420 dated Nov. 30, 2021 with English translation.

(Continued)

*Primary Examiner* — Shamim Ahmed
(74) *Attorney, Agent, or Firm* — Foley & Lardner LLP

(57) ABSTRACT

The present invention provides a polishing composition with which it is possible to decrease a level difference to be unintentionally generated between dissimilar materials and a level difference to be unintentionally generated between coarse and dense portions of a pattern. The present invention relates to a polishing composition which contains abrasive grains having an average primary particle size of 5 to 50 nm, a level difference modifier containing a compound with a specific structure, having an aromatic ring and a sulfo group or a salt group thereof which is directly bonded to this aromatic ring, and a dispersing medium and of which the pH is less than 7.

20 Claims, No Drawings

(56) References Cited

FOREIGN PATENT DOCUMENTS

| | | |
|---|---|---|
| JP | 2006-128552 A | 5/2006 |
| JP | 2006-179678 A | 7/2006 |
| JP | 2007-063372 A | 3/2007 |
| JP | 2007-214155 A | 8/2007 |
| JP | 2008-112970 A | 5/2008 |
| JP | 2008-181954 A | 8/2008 |
| JP | 2009-131947 A | 6/2009 |
| JP | 2009-172709 A | 8/2009 |
| JP | 2010-135052 A | 6/2010 |
| JP | 2010-155902 A | 7/2010 |
| JP | 2010-188514 A | 9/2010 |
| JP | 2011-018425 A | 1/2011 |
| JP | 2011-079111 A | 4/2011 |
| JP | 2011-131346 A | 7/2011 |
| JP | 2011-240478 A | 12/2011 |
| JP | 2012-015352 A | 1/2012 |
| JP | 2012-040671 A | 3/2012 |
| JP | 2012-178209 A | 9/2012 |
| JP | 2012-198976 A | 10/2012 |
| JP | 2012-199531 A | 10/2012 |
| JP | 2012-199532 A | 10/2012 |
| JP | 2013-045944 A | 3/2013 |
| JP | 2013-094906 A | 5/2013 |
| JP | 2013-140644 A | 7/2013 |
| JP | 2014-120189 A | 6/2014 |
| JP | 2014-130659 A | 7/2014 |
| JP | 2014-141667 A | 8/2014 |
| JP | 2015-137290 A | 7/2015 |
| JP | 2015-209485 A | 11/2015 |
| JP | 2015-224276 A | 12/2015 |
| JP | 2016-157913 A | 9/2016 |
| JP | 2016-222867 A | 12/2016 |
| JP | 2017-011162 A | 1/2017 |
| JP | 2017-075226 A | 4/2017 |
| JP | 2017-119783 A | 7/2017 |
| KR | 10-2012-0100820 | 9/2012 |
| KR | 10-2016-0043676 A | 4/2016 |
| KR | 2017-0061643 A | 6/2017 |
| TW | 201302997 A1 | 1/2013 |
| WO | WO-2009/096495 A1 | 8/2009 |
| WO | WO-2009/154164 A1 | 12/2009 |
| WO | WO-2010/074002 A1 | 7/2010 |
| WO | WO-2015/146468 A1 | 10/2015 |
| WO | WO-2015/187820 A1 | 12/2015 |

OTHER PUBLICATIONS

Office Action issued in corresponding Japanese Patent Application No. 2019-505739 dated Jan. 4, 2022 with English translation.

Notice of Reasons for Refusal in corresponding Application No. Japanese Patent Application No. 2019-505739 dated Jul. 5, 2022, with English translation (9 pages).

KR Office action issued in corresponding KR Appl. Ser. No. 10-2019-7026467, dated Nov. 16, 2022 (7 pages).

* cited by examiner

POLISHING COMPOSITION, PRODUCTION METHOD THEREFOR, AND POLISHING METHOD AND PRODUCTION METHOD FOR SUBSTRATE, USING POLISHING COMPOSITION

TECHNICAL FIELD

The present invention relates to a polishing composition, a method for producing the same, a polishing method using the same, and a method for manufacturing a substrate.

BACKGROUND ART

In the semiconductor device manufacturing process, there is a need for a technique to manufacture wiring with higher density and higher integration as the performance of semiconductor devices is improved. In such a manufacturing process of semiconductor devices, CMP (Chemical Mechanical Polishing) has become an essential process. As the miniaturization of semiconductor circuits progresses, the flatness required for the concavoconvex of patterned wafer has increased and it is required to realize high flatness in nano order by CMP. In order to realize high flatness by CMP, it is preferable to polish the convex portions of the patterned wafer at a high polishing speed but to hardly polish the concave portions.

Semiconductor wafers are composed of dissimilar materials such as polycrystalline silicon forming a circuit, silicon oxide which is an insulating material, and silicon nitride to protect the silicon dioxide surface which is not a part of trenches or vias from damage during etching. In the case of such patterned wafers, the actions of polishing composition on the respective materials are different from one another, it is thus difficult to form a perfect flat surface, and it is required to minimize the level differences generated among the dissimilar materials as much as possible.

One of the causes of the level difference includes the occurrence of a phenomenon such as dishing that materials which are relatively soft and likely to react with the polishing agent such as polycrystalline silicon, silicon oxide and the like are excessively scraped as compared to silicon nitride and the like in the vicinity thereof. As a technique to suppress the occurrence of this dishing phenomenon, JP 2012-040671 A (US 2013/0146804) discloses a polishing composition with which it is possible to polish an object to be polished which exhibits poor chemical reactivity such as silicon nitride and the like at a higher speed than polycrystalline silicon and the like and which contains colloidal silica on which an organic acid is immobilized and has a pH of 6 or less.

SUMMARY OF INVENTION

However, in the conventional polishing composition, there has been a problem that it is impossible to suppress a phenomenon that the silicon nitride in the vicinity of materials such as polycrystalline silicon, silicon oxide, and the like is more excessively scraped than the materials which is the opposite phenomenon to the dishing phenomenon.

Moreover, in the conventional polishing composition, there has been a problem that it is impossible to suppress a phenomenon that the polycrystalline silicon, silicon oxide, or silicon nitride is excessively scraped particularly at the portion at which a fine pattern is formed.

Accordingly, an object of the present invention is to provide a polishing composition with which it is possible to decrease a level difference to be unintentionally generated between dissimilar materials and a level difference to be unintentionally generated between coarse and dense portions of a pattern.

In order to solve the above problems, the present inventors have intensively conducted studies. As a result, it has been found out that the above problems can be solved by using a level difference modifier containing a compound with a specific structure, having an aromatic ring and a sulfo group or a salt group thereof which is directly bonded to this aromatic ring and concurrently using this level difference modifier with an abrasive grain having an average primary particle size of 5 to 50 nm, and the present invention has been thus completed.

In other words, the present invention is a polishing composition containing at least one kind of level difference modifier selected from the group consisting of a compound represented by the following Chemical Formula (1) and a salt of the compound, a compound represented by the following Chemical Formula (2) and a salt of the compound, a polymer composed of a structural unit represented by the following Chemical Formula (3) and a salt of the polymer, and a copolymer having a structural unit represented by the following Chemical Formula (3) and a structural unit derived from another monomer and a salt of the copolymer:

[Chem. 1]

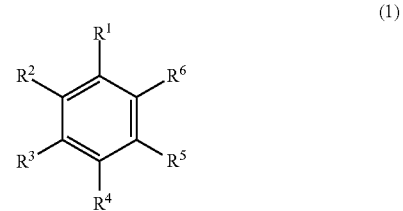

(1)

(in Formula (1), $R^1$ to $R^6$ each independently denote a hydrogen atom, a hydroxy group, a sulfo group, or an anionic group which does not have a sulfo group, a cationic group, an alkoxycarbonyl group having 2 to 6 carbon atoms, or a hydrocarbon group having 1 to 10 carbon atoms, and at this time, at least one of $R^1$ to $R^6$ denotes a sulfo group)

[Chem. 2]

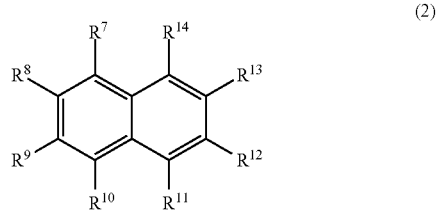

(2)

(in Formula (2), $R^7$ to $R^{14}$ each independently denote a hydrogen atom, a hydroxy group, a sulfo group, an anionic group which does not have a sulfo group, a cationic group, an alkoxycarbonyl group having 2 to 6 carbon atoms, or a hydrocarbon group having 1 to 10 carbon atoms, and at this time, at least one of $R^7$ to $R^{14}$ denotes a sulfo group)

[Chem. 3]

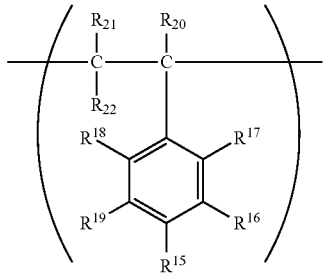

(3)

(in Formula (3), $R^{15}$, to $R^{19}$ each independently denote a hydrogen atom, a hydroxy group, a sulfo group, an anionic group which does not have a sulfo group, a cationic group, an alkoxycarbonyl group having 2 to 6 carbon atoms, or a hydrocarbon group having 1 to 10 carbon atoms, at this time, at least one of $R^{15}$ to $R^{19}$ denotes a sulfo group, $R^{20}$ to $R^{22}$ each independently denote a hydrogen atom, a hydroxy group, an anionic group which does not have a sulfo group, a cationic group, an alkoxycarbonyl group having 2 to 6 carbon atoms, or a hydrocarbon group having 1 to 10 carbon atoms which is not substituted or may be substituted with a hydroxy group, an anionic group which does not have a sulfo group, a cationic group, or an alkoxycarbonyl group having 2 to 6 carbon atoms); and a dispersing medium, in which a pH is less than 7.

DESCRIPTION OF EMBODIMENTS

Hereinafter, the present invention will be described. Incidentally, the present invention is not limited only to the following embodiments. In the present specification, "X to Y" indicating a range means "X or more and Y or less". In addition, in the present specification, operations, measurements, and the like of physical properties are performed under the conditions of room temperature (20° C. to 25° C.)/relative humidity of 40% to 50% RH unless otherwise stated.

<Polishing Composition>

According to an aspect of the present invention, there is provided a polishing composition containing at least one kind of level difference modifier selected from the group consisting of a compound represented by the following Chemical Formula (1) and a salt of the compound, a compound represented by the following Chemical Formula (2) and a salt of the compound, a polymer composed of a structural unit represented by the following Chemical Formula (3) and a salt of the polymer, and a copolymer having a structural unit represented by the following Chemical Formula (3) and a structural unit derived from another monomer and a salt of the copolymer:

[Chem. 4]

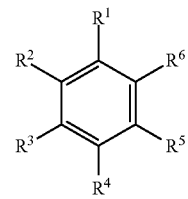

(1)

(in Formula (1), $R^1$ to $R^6$ each independently denote a hydrogen atom, a hydroxy group, a sulfo group, or an anionic group which does not have a sulfo group, a cationic group, an alkoxycarbonyl group having 2 to 6 carbon atoms, or a hydrocarbon group having 1 to 10 carbon atoms, and at this time, at least one of $R^1$ to $R^6$ denotes a sulfo group)

[Chem. 5]

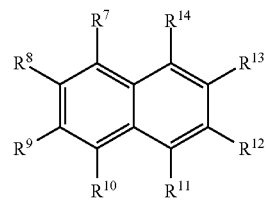

(2)

(in Formula (2), $R^7$ to $R^{14}$ each independently denote a hydrogen atom, a hydroxy group, a sulfo group, an anionic group which does not have a sulfo group, a cationic group, an alkoxycarbonyl group having 2 to 6 carbon atoms, or a hydrocarbon group having 1 to 10 carbon atoms, and at this time, at least one of $R^7$ to $R^{14}$ denotes a sulfo group)

[Chem. 6]

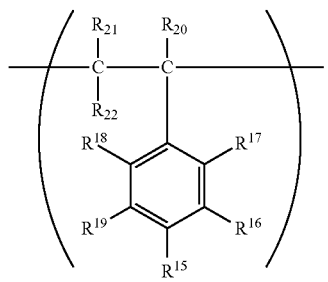

(3)

(in Formula (3), $R^{15}$ to $R^{19}$ each independently denote a hydrogen atom, a hydroxy group, a sulfo group, an anionic group which does not have a sulfo group, a cationic group, an alkoxycarbonyl group having 2 to 6 carbon atoms, or a hydrocarbon group having 1 to 10 carbon atoms, at this time, at least one of $R^{15}$ to $R^{19}$ denotes a sulfo group, $R^{20}$ to $R^{22}$ each independently denote a hydrogen atom, a hydroxy group, an anionic group which does not have a sulfo group, a cationic group, an alkoxycarbonyl group having 2 to 6 carbon atoms, or a hydrocarbon group having 1 to 10 carbon atoms which is not substituted or may be substituted with a hydroxy group, an anionic group which does not have a sulfo group, a cationic group, or an alkoxycarbonyl group having 2 to 6 carbon atoms); and a dispersing medium, in which a pH is less than 7. According to an aspect of the present invention, it is possible to decrease a level difference to be unintentionally generated between dissimilar materials and a level difference to be unintentionally generated between coarse and dense portions of a pattern.

The present inventors presume the mechanism by which a level difference to be unintentionally generated between dissimilar materials and a level difference to be unintentionally generated between coarse and dense portions of a pattern can be decreased by such a configuration as follows. Incidentally, a case in which the object to be polished is a patterned wafer will be described below, but the object to be polished is not limited to this.

First, on the patterned wafer before being polished which is the object to be polished, the level difference modifier adheres to the wafer surface so that the sulfo group or a salt group thereof faces the wafer side and the other portion faces the opposite side (dispersing medium side) to gently protect the wafer surface from the mechanical action of abrasive grains. As a result, the wafer is not excessively polished at the concave portion while being favorably polished at the convex portion, and the level difference between the lower layer material at the convex portion and the upper layer material at the concave portion is decreased when the lower layer surface of the convex portion is exposed after polishing and thus a flatter patterned wafer is obtained.

In addition, as the level difference modifier is adsorbed to the surface of the patterned wafer after the lower layer surface is exposed, the wafer surface is gently protected from the mechanical action by abrasive grains regardless of the difference in material. As a result, a phenomenon that some materials among polycrystalline silicon, silicon oxide, and silicon nitride or all of these are excessively scraped at the portion forming the fine pattern is suppressed, and a flatter patterned wafer is obtained.

Incidentally, the mechanism is based on presumption and the present invention is not limited to the mechanism at all. Hereinafter, the configuration of the polishing composition according to an aspect of the present invention will be described in detail.

(Level Difference Modifier)

The polishing composition according to an aspect of the present invention contains a level difference modifier in order to decrease the level difference to be unintentionally generated between dissimilar materials and the level difference to be unintentionally generated between coarse and dense portions of a pattern.

The level difference modifier contained in the polishing composition according to an aspect of the present invention is at least one kind selected from the group consisting of a compound represented by the following Chemical Formula (1) and a salt of the compound, a compound represented by the following Chemical Formula (2) and a salt of the compound, a polymer composed of a structural unit represented by the following Chemical Formula (3) and a salt of the polymer, and a copolymer having a structural unit represented by the following Chemical Formula (3) and a structural unit derived from another monomer and a salt of the copolymer:

[Chem. 7]

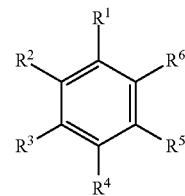

(1)

(in Formula (1), $R^1$ to $R^6$ each independently denote a hydrogen atom, a hydroxy group, a sulfo group, or an anionic group which does not have a sulfo group, a cationic group, an alkoxycarbonyl group having 2 to 6 carbon atoms, or a hydrocarbon group having 1 to 10 carbon atoms, and at this time, at least one of $R^1$ to $R^6$ denotes a sulfo group)

[Chem. 8]

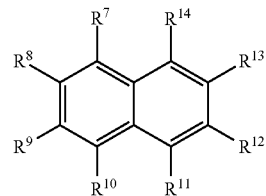

(2)

(in Formula (2), $R^7$ to $R^{14}$ each independently denote a hydrogen atom, a hydroxy group, a sulfo group, an anionic group which does not have a sulfo group, a cationic group, an alkoxycarbonyl group having 2 to 6 carbon atoms, or a hydrocarbon group having 1 to 10 carbon atoms, and at this time, at least one of $R^1$ to $R^{14}$ denotes a sulfo group)

[Chem. 9]

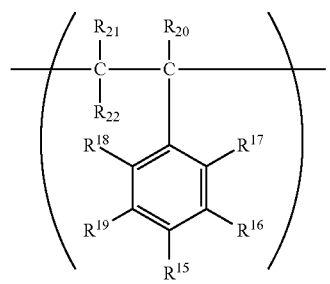

(3)

(in Formula (3), $R^{15}$ to $R^{19}$ each independently denote a hydrogen atom, a hydroxy group, a sulfo group, an anionic group which does not have a sulfo group, a cationic group, an alkoxycarbonyl group having 2 to 6 carbon atoms, or a hydrocarbon group having 1 to 10 carbon atoms, at this time, at least one of $R^{15}$ to $R^{19}$ denotes a sulfo group, $R^{20}$ to $R^{22}$ each independently denote a hydrogen atom, a hydroxy group, an anionic group which does not have a sulfo group, a cationic group, an alkoxycarbonyl group having 2 to 6 carbon atoms, or a hydrocarbon group having 1 to 10 carbon atoms which is not substituted or may be substituted with a hydroxy group, an anionic group which does not have a sulfo group, a cationic group, or an alkoxycarbonyl group having 2 to 6 carbon atoms).

It is preferable that the level difference modifier is the polymer composed of a structural unit represented by Chemical Formula (3) above or a salt thereof or the copolymer having a structural unit represented by Chemical Formula (3) above and a structural unit derived from another monomer or a salt thereof from the viewpoint of decreasing the level difference to be unintentionally generated between coarse and dense portions of the pattern.

In the present specification, an anionic group means a functional group in which a counter ion is dissociated to become an anion and a "cationic group" means a functional group in which a counter ion is dissociated or bonded to a cationic species generated by ionization of another ionic compound and thus becomes a cation.

The compound represented by Chemical Formula (1) above or a salt thereof is preferably a compound represented by Formula (1) in which $R^1$ denotes a sulfo group and $R^2$ to RE each independently denote a hydrogen atom, a hydroxy group, an anionic group which does not have a sulfo group, a cationic group, an alkoxycarbonyl group having 2 to 6 carbon atoms, or a hydrocarbon group having 1 to 10 carbon atoms, or a salt thereof.

In addition, the compound represented by Chemical Formula (1) above or a salt thereof is more preferably a compound represented by Formula (1) in which $R^1$ denotes a sulfo group and $R^2$ to $R^6$ each independently denote a hydrogen atom, a hydroxy group, a carboxy group, a phosphoric acid group, an amino group, an alkoxycarbonyl group having 2 to 6 carbon atoms, or a hydrocarbon group having 1 to 10 carbon atoms, or a salt thereof.

Moreover, the compound represented by Chemical Formula (1) above or a salt thereof is still more preferably a compound represented by Formula (1) in which $R^1$ denotes a sulfo group and $R^2$ to $R^6$ each independently denote a hydrogen atom, an amino group, or a hydrocarbon group having 1 to 10 carbon atoms, or a salt thereof.

The compound represented by Chemical Formula (2) above or a salt thereof is preferably a compound represented by Formula (2) in which one of $R^7$ or $R^8$ denotes a sulfo group, the other of $R^7$ or $R^8$ denotes a hydrogen atom, a hydroxy group, an anionic group which does not have a sulfo group, a cationic group, an alkoxycarbonyl group having 2 to 6 carbon atoms, or a hydrocarbon group having 1 to 10 carbon atoms, and $R^9$ to $R^{14}$ each independently denote a hydrogen atom, a hydroxy group, an anionic group which does not have a sulfo group, a cationic group, an alkoxycarbonyl group having 2 to 6 carbon atoms, or a hydrocarbon group having 1 to 10 carbon atoms, or a salt thereof.

In addition, the compound represented by Chemical Formula (2) above or a salt thereof is more preferably a compound represented by Formula (2) in which one of $R^7$ or $R^8$ denotes a sulfo group, the other of $R^7$ or $R^8$ denotes a hydrogen atom, a hydroxy group, a carboxy group, a phosphoric acid group, an amino group, an alkoxycarbonyl group having 2 to 6 carbon atoms, or a hydrocarbon group having 1 to 10 carbon atoms, and $R^9$ to $R^{14}$ each independently denote a hydrogen atom, a hydroxy group, a carboxy group, a phosphoric acid group, an amino group, an alkoxycarbonyl group having 2 to 6 carbon atoms, or a hydrocarbon group having 1 to 10 carbon atoms, or a salt thereof.

Moreover, the compound represented by Chemical Formula (2) above or a salt thereof is still more preferably a compound represented by Formula (2) in which one of $R^7$ or $R^8$ denotes a sulfo group, the other of $R^7$ or $R^8$ denotes a hydrogen atom, and $R^9$ to $R^{14}$ each independently denote a hydrogen atom or a hydroxy group, or a salt thereof.

The polymer composed of a structural unit represented by Chemical Formula (3) above or a salt thereof and the copolymer having a structural unit represented by the following Chemical Formula (3) and a structural unit derived from another monomer or a salt thereof are each preferably a polymer composed of a structural unit represented by the following Chemical Formula (4) or a salt thereof and a copolymer having a structural unit represented by following Chemical formula (4) and a structural unit derived from another monomer or a salt thereof.

[Chem. 10]

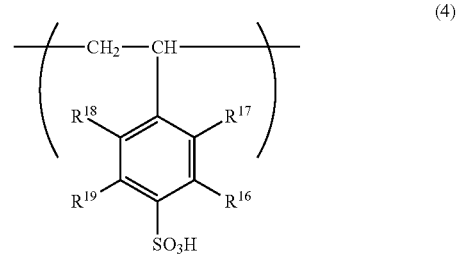

(In Formula (4), $R^{16}$ to $R^{19}$ each independently denote a hydrogen atom, a hydroxy group, an anionic group which does not have a sulfo group or a salt group thereof, a cationic group, an alkoxycarbonyl group having 2 to 6 carbon atoms, or a hydrocarbon group having 1 to 10 carbon atoms).

In addition, it is more preferable that $R^{16}$ to $R^{19}$ in Chemical formula (4) above each independently denote a hydrogen atom, a hydroxy group, a carboxy group, a phosphoric acid group, an amino group, an alkoxycarbonyl group having 2 to 6 carbon atoms, or a hydrocarbon group having 1 to 10 carbon atoms.

In Formulas (1) to (4) above, the amino group represents a —$NH_2$ group, a —NHR group, or a —NRR' group (R and R' denote a substituent) but a —$NH_2$ group is preferable among these. In addition, as the alkoxycarbonyl group having 2 to 6 carbon atoms, a methoxycarbonyl group, an ethoxycarbonyl group, an n-propyloxycarbonyl group, an isopropyloxycarbonyl group, an n-butoxycarbonyl group, a sec-butoxycarbonyl group, and a tert-butoxycarbonyl group are preferable and a methoxycarbonyl group is more preferable. Moreover, as the hydrocarbon group having 1 to 10 carbon atoms, a methyl group, an ethyl group, a n-propyl group, an isopropyl group, a n-butyl group, a sec-butyl group, and a tert-butyl group are preferable and a methyl group is more preferable.

The main chain of the copolymer having a structural unit represented by Chemical Formula (3) above and a structural unit derived from another monomer or a salt thereof may be composed only of carbon atoms or oxygen atoms and nitrogen atoms may be contained at a part of the main chain in addition to carbon atoms.

The structural unit derived from another monomer in the copolymer having a structural unit represented by Chemical Formula (3) above and a structural unit derived from another monomer or a salt thereof is not particularly limited, and known ones can be used. Examples of such another monomer include ethylenically unsaturated monomers, diamines, diepoxides and the like.

The ethylenically unsaturated monomer is not particularly limited, and examples thereof include styrene-based monomers such as styrene, o-methylstyrene, m-methylstyrene, p-methylstyrene, α-methylstyrene, p-phenyl styrene, p-ethyl styrene, 2,4-dimethyl styrene, p-tert-butylstyrene, p-n-hexylstyrene, p-n-octylstyrene, p-n-nonylstyrene, p-n-decylstyrene, p-n-dodecylstyrene and the like; (meth)acrylic acid ester-based monomers such as methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, n-octyl (meth)acrylate, 2-ethylhexyl (meth)acrylate, stearyl (meth)acrylate, lauryl (meth)acrylate, phenyl (meth)acrylate, diethylaminoethyl (meth)acrylate, dimethylaminoethyl (meth)acrylate and the like; carboxy group-containing vinyl-based monomers such as (meth)acrylic acid, maleic acid, itaconic acid, cinnamic acid, fumaric acid, maleic acid monoalkyl ester, itaconic acid monoalkyl ester and the like; olefin-based monomers such as ethylene, propylene, isobutylene and the like; vinyl ester-based monomers such as vinyl propionate, vinyl acetate, vinyl benzoate and the like; vinyl ether-based monomers such as vinyl methyl ether, vinyl ethyl ether and the like; vinyl ketone-based monomers such as vinyl methyl ketone, vinyl ethyl ketone, and vinyl hexyl ketone and the like; N-vinyl-based monomers such as N-vinylcarbazole, N-vinyl indole, N-vinyl formamide, N-vinyl pyrrolidone and the like; vinyl-based monomers such as vinyl naphthalene, vinyl pyridine and the like; (meth)acrylic acid derivatives such as acrylonitrile, methacrylonitrile, acrylamide and the like, and the like. One kind of these may be used singly, or two or more kinds thereof may be used in combination. Incidentally, in the present specification, (meth)acrylic is a generic term including acrylic and methacrylic and the (meth) acrylate is a generic term including an acrylate and a methacrylate. Among these, ethylenically unsaturated monomers are preferable, styrene-based monomers, carboxy group-containing vinyl-based monomers, or N-vinyl-based monomers are more preferable, styrene, (meth)acrylic acid, maleic acid, N-vinylformamide, N-vinylpyrrolidone are still more preferable, and styrene is particularly preferable.

The level difference modifier according to an aspect of the present invention may be in the state of a compound represented by Chemical Formula (1) above or a salt thereof, a compound represented by Chemical Formula (2) above or a salt thereof, a polymer composed of a structural unit represented by Chemical Formula (3) above or a salt thereof, or a copolymer having a structural unit represented by Chemical Formula (3) above and a structural unit derived from another monomer or a salt thereof itself or may be in the state of hydrates of these at the time of mixing.

As the level difference modifier, m-xylenesulfonic acid or a salt thereof, p-toluidine-2-sulfonic acid or a salt thereof, 2-naphthol-6-sulfonic acid or a salt thereof, 1-naphthalenesulfonic acid or a salt thereof, or a para-styrenesulfonic acid-styrene copolymer or a salt thereof is preferable, m-xylenesulfonic acid, p-toluidine-2-sulfonic acid, sodium 2-naphthol-6-sulfonate, 1-naphthalenesulfonic acid, or a para-styrenesulfonic acid-styrene copolymer or a salt thereof is more preferable, and a para-styrenesulfonic acid-styrene copolymer or a salt thereof is still more preferable.

In the case of concurrently using two or more kinds of level difference modifiers, it is preferable to concurrently use the compound represented by Chemical Formula (1) above or a salt thereof or the compound represented by Chemical Formula (2) above or a salt thereof with the polymer composed of a structural unit represented by Chemical Formula (3) above or a salt thereof or the copolymer having a structural unit represented by Chemical Formula (3) above and a structural unit derived from another monomer or a salt thereof.

In addition, in the case of concurrently using two or more kinds of level difference modifiers, it is more preferable to concurrently use the compound represented by Chemical Formula (1) above or a salt thereof with the polymer composed of a structural unit represented by Chemical Formula (3) above or a salt thereof or the copolymer having a structural unit represented by Chemical Formula (3) above and a structural unit derived from another monomer or a salt thereof.

Moreover, in the case of concurrently using two or more kinds of level difference modifiers, it is still more preferable to concurrently use p-toluidine-2-sulfonic acid with a para-styrenesulfonic acid-styrene copolymer or a salt thereof.

In addition, between the polymer composed of a structural unit represented by Chemical Formula (3) above or a salt thereof and the copolymer having a structural unit represented by Chemical Formula (3) above and a structural unit derived from another monomer or a salt thereof, the copolymer having a structural unit represented by Chemical Formula (3) above and a structural unit derived from another monomer or a salt thereof is more preferable from the viewpoint of more favorably exerting the effects of the present invention.

In the copolymer having a structural unit represented by Chemical Formula (3) above and a structural unit derived from another monomer or a salt thereof, the lower limit of the content proportion of the structural unit represented by Chemical Formula (3) above to the total number of moles of the structural unit represented by Chemical Formula (3) above and the structural unit derived from another monomer is preferably 1 mol % or more, more preferably 5 mol % or more, still more preferably 10 mol % or more, and particularly preferably 30 mol % or more. In addition, the upper limit of the content proportion of the structural unit represented by Chemical Formula (3) above to the total number of moles of the structural unit represented by Chemical Formula (3) above and the structural unit derived from another monomer is preferably 99 mol % or less, more preferably 95 mol % or less, still more preferably 90 mol % or less, and particularly preferably 70 mol % or less. If the content proportion is in such a range, it is possible to more favorably exert the effects of the present invention.

The lower limit of the weight average molecular weight of the polymer composed of a structural unit represented by Chemical Formula (3) above or a salt thereof or the copolymer having a structural unit represented by Chemical Formula (3) above and a structural unit derived from another monomer or a salt thereof is preferably 1000 or more, more preferably 2000 or more, still more preferably 3000 or more, and particularly preferably 10000 or more. In addition, the upper limit of the weight average molecular weight of the polymer composed of a structural unit represented by Chemical Formula (3) above or a salt thereof or the copolymer having a structural unit represented by Chemical Formula (3) above and a structural unit derived from another monomer or a salt thereof is preferably 1,000,000 or less, more preferably 100,000 or less, still more preferably 50,000 or less, and particularly preferably 30,000 or less. If the content proportion is in such a range, it is possible to more favorably exert the effects of the present invention.

Incidentally, the weight average molecular weight of the polymer composed of a structural unit represented by Chemical Formula (3) above or a salt thereof or the copolymer having a structural unit represented by Chemical Formula (3) above and a structural unit derived from another monomer or a salt thereof can be specifically measured by the method described in Examples.

In a case in which the level difference modifier is a salt, a part or whole of the sulfo groups or other functional groups capable of forming a salt may be a salt. Examples of the salt include alkali metal salts such as sodium salts, potassium salts and the like, salts of Group 2 elements such as calcium salts, magnesium salts and the like, amine salts, ammonium salts and the like. Among these, sodium salts are particularly preferable.

The lower limit of the content of the level difference modifier in the polishing composition is preferably 0.0001 g/L or more and more preferably 0.001 g/L or more. In addition, the upper limit of the content of the level difference modifier in the polishing composition is preferably 100 g/L or less and more preferably 5 g/L or less. If the content proportion is in such a range, it is possible to more favorably exert the effects of the present invention. For this reason, examples of the polishing composition according to a preferred aspect of the present invention include a polishing composition containing a level difference modifier at 0.001 g/L or more and 5 g/L or less.

The lower limit of the content of the level difference modifier which is the compound represented by Chemical Formula (1) above or a salt thereof or the compound represented by Chemical Formula (2) above or a salt thereof in the polishing composition is still more preferably 0.01 g/L or more, particularly preferably 0.1 g/L or more, and most preferably 0.6 g/L or more. In addition, the upper limit of the content of the level difference modifier which is the compound represented by Chemical Formula (1) above or a salt thereof or the compound represented by Chemical Formula (2) above or a salt thereof in the polishing composition is still more preferably 4 g/L or less. If the content is in such a range, it is possible to extremely favorably exert the effects of the present invention.

Incidentally, the lower limit of the content of the polymer composed of a structural unit represented by Chemical Formula (3) above or a salt thereof or the copolymer having a structural unit represented by Chemical Formula (3) above and a structural unit derived from another monomer or a salt thereof in the polishing composition is still more preferably 0.005 g/L or more. In addition, the upper limit of the content of the polymer composed of a structural unit represented by Chemical Formula (3) above or a salt thereof or the copolymer having a structural unit represented by Chemical Formula (3) above and a structural unit derived from another monomer or a salt thereof in the polishing composition is still more preferably 0.1 g/L or less and particularly preferably 0.05 g/L or less. If the content is in such a range, it is possible to extremely favorably exert the effects of the present invention.

Incidentally, in the case of mixing the level difference modifier in the state of a hydrate at the time of mixing of the level difference modifier at the time of production of the polishing composition, the preferred content of the level difference modifier in the polishing composition indicates the content calculated from the mass excluding the hydrated water.

(Abrasive Grain)

The polishing composition according to an aspect of the present invention contains abrasive grains having an average primary particle size of 5 to 50 nm. Abrasive grains have an action of mechanically polishing an object to be polished and improve the polishing speed of the object to be polished by the polishing composition.

When the average primary particle size of abrasive grains in the polishing composition is less than 5 nm, the polishing speed is insufficient and it is difficult to sufficiently exert the polishing action as a polishing composition. For this reason, the lower limit value of the average primary particle size of abrasive grains in the polishing composition is 5 nm or more, preferably 7 nm or more, and more preferably 10 nm or more. When the average primary particle size of abrasive grains in the polishing composition is more than 50 nm, scratches are noticeable on the surface of the object to be polished after being polished by the polishing composition and it is difficult to sufficiently exert the flattening effect as a polishing composition. For this reason, the upper limit value of the average primary particle size of abrasive grains in the polishing composition is 50 nm or less, more preferably 45 nm or less, and still more preferably 40 nm or less. Moreover, the upper limit value of the average primary particle size of abrasive grains in the polishing composition is particularly preferably 25 nm or less from the viewpoint of further decreasing the level difference to be unintentionally generated between dissimilar materials and the level difference to be unintentionally generated between coarse and dense portions of the pattern. Incidentally, the value of the average primary particle size of abrasive grains is calculated, for example, based on the specific surface area of abrasive grains measured by a BET method.

The average secondary particle size of abrasive grains in the polishing composition is preferably 5 nm or more, more preferably 10 nm or more, still more preferably 15 nm or more, and particularly preferably 20 nm or more. As the average secondary particle size of abrasive grains increases, the polishing speed of the object to be polished by the polishing composition is further improved. The average secondary particle size of abrasive grains in the polishing composition is preferably 100 nm or less, more preferably 90 nm or less, and still more preferably 80 nm or less. As the average secondary particle size of abrasive grains decreases, the generation of scratches on the surface of the object to be polished after being polished by the polishing composition can be suppressed. Moreover, the upper limit value of the average secondary particle size of abrasive grains in the polishing composition is particularly preferably 50 nm or less from the viewpoint of further decreasing the level difference to be unintentionally generated between dissimilar materials and the level difference to be unintentionally generated between coarse and dense portions of the pattern. Incidentally, the value of the average secondary particle size of abrasive grains is calculated, for example, based on the specific surface area of abrasive grains measured by a light scattering method using a laser beam.

The abrasive grains may be any of inorganic particles, organic particles, or organic-inorganic composite particles. Examples of the inorganic particles include particles formed of metal oxides such as silica, alumina, ceria, titania and the like, silicon nitride particles, silicon carbide particles, and boron nitride particles. Specific examples of the organic particles include polymethyl methacrylate (PMMA) particles. Among these, silica is preferable and colloidal silica is more preferable from the viewpoint of easy availability and the cost. Incidentally, one kind of these abrasive grains may be used singly or two or more kinds thereof may be used in combination. In addition, as the abrasive grain, a commercially available product may be used or a synthetic product may be used.

The abrasive grains may have been subjected to surface modification. The value of zeta potential of ordinary colloidal silica is close to zero under acidic conditions and thus the silica particles do not electrically repel each other under acidic conditions and are likely to be aggregated. In contrast, abrasive grains which have been subjected to surface modification so that the zeta potential thereof has a relatively large negative value even under acidic conditions strongly repel each other even under acidic conditions and are favorably dispersed, and as a result, the polishing speed and storage stability of the polishing composition can be further improved. Among these, particularly preferred one is silica (organic acid-modified silica) in which an organic acid is immobilized on the surface.

Silica in which an organic acid is immobilized on the surface include fumed silica, colloidal silica and the like, and colloidal silica is particularly preferable. The organic acid is not particularly limited, and examples thereof include sulfonic acid, carboxylic acid, phosphoric acid and the like, and sulfonic acid or carboxylic acid is preferable. Incidentally, an acidic group (for example, a sulfo group, a carboxy group, a phosphoric acid group or the like) derived from the organic acid is immobilized on the surface of the silica which is contained in the polishing composition of the present invention and in which an organic acid is immobilized on the surface by a covalent bond (via a linker structure in some cases).

The method for introducing these organic acids into the silica surface is not particularly limited, but examples thereof include a method in which an acidic group derived from the organic acid is introduced into the silica surface in a state in which a protecting group is bonded to the acidic group and then the protecting group is eliminated in addition to a method in which an acid group is introduced into the silica surface in the state of a mercapto group, an alkyl group, or the like and then oxidized into a sulfonic acid or a carboxylic acid. In addition, the compound to be used when an organic acid is introduced into the silica surface is not particularly limited, but it is preferable to have at least one functional group which can be an organic acid group and to further have a functional group to be used in bonding with the hydroxyl group on the silica surface, a functional group to be introduced in order to control the hydrophobicity/hydrophilicity, a functional group to be introduced in order to control the steric bulk and the like.

As a specific synthetic method of silica in which an organic acid is immobilized on the surface, synthesis can be performed by the method described in, for example, "Sulfonic acid-functionalized silica through quantitative oxidation of thiol groups", Chem. Commun. 246-247 (2003) if sulfonic acid which is a kind of organic acid is immobilized on the surface of silica. Specifically, it is possible to obtain silica in which sulfonic acid is immobilized on the surface by coupling a silane coupling agent having a thiol group such as 3-mercaptopropyltrimethoxysilane or the like with silica and then oxidizing the thiol group with hydrogen peroxide. Alternatively, synthesis can be performed by the method described in, for example, "Novel Silane Coupling Agents Containing a Photolabile 2-Nitrobenzyl Ester for Introduction of a Carboxy Group on the Surface of Silica Gel", Chemistry Letters, 3, 228-229 (2000) if a carboxylic acid is immobilized on the surface of silica. Specifically, it is possible to obtain silica in which a carboxylic acid is immobilized on the surface by coupling a silane coupling agent containing a photoreactive 2-nitrobenzyl ester with silica and then performing photoirradiation.

Incidentally, silica in which an organic acid is not immobilized on the surface may be concurrently used in the case of using silica in which an organic acid is immobilized on the surface as abrasive grains. However, the content proportion of the silica in which an organic acid is immobilized on the surface in the entire abrasive grains is preferably 50 mass % or more, more preferably 80 mass % or more, still more preferably 90 mass % or more, particularly preferably 95 mass % or more, and most preferably 100 mass % on a mass basis.

The lower limit value of the content of abrasive grains in the polishing composition is preferably 0.0005 mass % or more, more preferably 0.001 mass % or more, still more preferably 0.005 mass % or more, yet still more preferably 0.01 mass % or more, and particularly preferably 0.1 mass % or more. As the content of abrasive grains increases, the polishing speed of the object to be polished by the polishing composition is further improved. The content of abrasive grains in the polishing composition is preferably 10 mass % or less, more preferably 5 mass % or less, still more preferably 3 mass % or less, yet still more preferably 1 mass % or less, and particularly preferably 0.5 mass % or less. As the content of abrasive grains decreases, it is possible to further decrease the level difference to be unintentionally generated between coarse and dense portions of the pattern.

(Polyoxyalkylene Group-Containing Compound)

It is preferable that the polishing composition according to an aspect of the present invention further contains a polyoxyalkylene group-containing compound in order to decrease the level difference to be unintentionally generated between dissimilar materials and the level difference to be unintentionally generated between coarse and dense portions of the pattern.

The details of the level difference decreasing effect are unknown, but it is presumed that the level difference decreasing effect is obtained by controlling the polishing speed of the object to be polished by the polishing composition as the polyoxyalkylene group-containing compound is adsorbed to the surface of the object to be polished by the action of hydrogen bond and the like and the surface of the object to be polished is protected from the mechanical action by abrasive grains. However, the mechanism is based on presumption and the present invention is not limited to the mechanism at all.

The "polyoxyalkylene group-containing compound" is an organic compound having a polyoxyalkylene group. The "polyoxyalkylene group-containing compound" may be a compound obtained by substituting or polymerizing a part of functional groups of a compound having a polyoxyalkylene group. These may be used singly or two or more kinds thereof may be used concurrently.

Specific examples of the polyoxyalkylene group include a polyoxyethylene group, a polyoxypropylene group, a polyoxyalkylene group in which an oxyethylene group and an oxypropylene group are block or random bonded to each other, a group in which a polyoxybutylene group is further contained in the polyoxyethylene group, polyoxypropylene group, or polyoxyalkylene group by a block or a random bond, and the like.

Specific examples of a compound in which the end of the polyoxyalkylene group is a hydroxyl group include polyalkylene glycol derivatives such as polyethylene glycol, polypropylene glycol, polybutylene glycol and the like in various addition amounts, block types typified by PRONON (registered trademark) series (all manufactured by NOF CORPORATION) such as PRONON (registered trademark) 102, PRONON (registered trademark) 201 and the like, bisphenol A derivatives such as UNIOL (registered trademark) DA-400, UNIOL (registered trademark) DB-400, and UNIOL (registered trademark) DB-530 (all manufactured by NOF CORPORATION), and the like.

Specific examples of a compound in which the end of the polyoxyalkylene group is an ether group include various kinds of polyalkylene glycol alkyl ethers such as polyethylene glycol monomethyl ether (polyoxyethylene-monomethyl ether), polyethylene glycol monooleyl ether, polyethylene glycol dimethyl ether and the like.

Specific examples of a compound in which the end of the polyoxyalkylene group is an ester group include polyalkylene glycol alkyl esters such as polyethylene glycol monooctyl ester and polypropylene glycol monostearyl ester, polypropylene glycol distearyl ester and the like.

Specific examples of a compound in which the end of the polyoxyalkylene group is an allyl group include various kinds of polyalkylene glycol allyl ethers such as UNIOX (registered trademark) PKA-5006, UNIOL (registered trademark) PKA-5014, UNIOL (registered trademark) PKA-5017 (all manufactured by NOF CORPORATION) and the like.

Specific examples of a compound in which the end of the polyoxyalkylene group is a (meth)acryl group include polyalkylene glycol (meth)acrylates such as BLEMMER (registered trademark) PP series, BLEMMER (registered trademark) PME series, and BLEMMER (registered trademark) PDE series (all manufactured by NOF CORPORATION) and the like.

Among these, the polyoxyalkylene group-containing compound is preferably polyethylene glycol, polypropylene glycol, or polyethylene glycol methyl ether, more preferably polypropylene glycol or polyethylene glycol methyl ether, and still more preferably polyethylene glycol methyl ether.

It is still more preferable that the polyoxyalkylene group-containing compound has two or more peaks in the molecular weight distribution (in terms of polyethylene glycol) measured by gel permeation chromatography (GPC).

The details of the more intensive level difference decreasing effect by the polyoxyalkylene group-containing compound having two or more peaks in the molecular weight distribution are unknown, but it is presumed that the level difference decreasing effect is obtained as follows. First, as the polishing composition contains a polyoxyalkylene group-containing compound having two or more peaks in the molecular weight distribution, the polyoxyalkylene group-containing compound is further adsorbed to the object to be polished so that a compound having a lower molecular weight fills the gap at which a compound having a higher molecular weight is adsorbed to the object to be polished. As a result, a dense protective film is formed on the surface of the object to be polished, and the level difference decreasing effect is further improved. However, the mechanism is based on presumption and the present invention is not limited to the mechanism at all.

Here, "having two or more peaks" means that the molecular weight distribution chart of the polyoxyalkylene group-containing compound by GPC has two or more maximum values. Typically, it is possible to obtain a composition which satisfies the condition of "having two or more peaks" as described above by producing a polishing composition using two or more kinds of polyoxyalkylene group-containing compounds having different weight average molecular weights as to be described in the section of the method for producing a polishing composition later.

In a case in which there are two or more peaks in the molecular weight distribution (in terms of polyethylene glycol) by GPC measured for the polyoxyalkylene group-containing compound, the weight average molecular weights of at least two peaks are different from each other by preferably 1.1 times or more, more preferably by 1.3 times or more, and still more preferably by 1.5 times or more in the weight average molecular weights of the respective peaks corresponding to the two or more peaks. By having such a configuration, it is possible to more favorably exert the effects of the present invention.

In addition, in a case in which there are two peaks in the molecular weight distribution, the weight average molecular weight of the peak having a lower molecular weight is preferably 100 or more and 2000 or less, more preferably 100 or more and 1000 or less, and still more preferably 100 or more and less than 500. On the other hand, the weight average molecular weight of the peak having a higher molecular weight is preferably 300 or more and 1,000,000 or less, more preferably 300 or more and 100000 or less, still more preferably 500 or more and 10000 or less, and particularly preferably 500 or more and 1000 or less.

Furthermore, in a case in which there are three or more peaks in the molecular weight distribution, the weight average molecular weight of the peak having a lower molecular weight between the molecular weights of arbitrary two peaks selected from the three or more peaks is preferably 100 or more and 2000 or less, more preferably 100 or more and 1000 or less, and still more preferably 100 or more and less than 300. In addition, the weight average molecular weight of the peak having a higher molecular weight between the molecular weights of arbitrary two peaks selected from the three or more peaks is preferably 300 or more and 1,000,000 or less, more preferably 300 or more and 100000 or less, still more preferably 500 or more and 10000 or less, and particularly preferably 500 or more and 1000 or less.

Incidentally, the weight average molecular weight of the polyoxyalkylene group-containing compound can be specifically measured by the method described in Examples.

The lower limit of the content of the polyoxyalkylene group-containing compound in the polishing composition is preferably 0.01 g/L or more, more preferably 0.1 g/L or more, still more preferably 0.2 g/L or more, and particularly preferably 0.5 g/L or more. In addition, the upper limit of the content of the polyoxyalkylene group-containing compound in the polishing composition is preferably 20 g/L or less, more preferably 10 g/L or less, still more preferably 5 g/L or less, and particularly preferably 1 g/L or less. If the content proportion is in such a range, it is possible to more favorably exert the effects of the present invention.

(pH Adjusting Agent)

It is preferable that the polishing composition according to an aspect of the present invention further contains a pH adjusting agent in order to adjust the pH to a desired pH value.

The pH adjusting agent is not particularly limited, and known pH adjusting agents used in the field of polishing composition can be used. Among these, known acids, bases, salts, amines, chelating agents and the like are preferably used. Examples of the pH adjusting agent include carboxylic acids such as formic acid, acetic acid, propionic acid, butyric acid, valeric acid, caproic acid, enantoic acid, caprylic acid, pelargonic acid, capric acid, lauric acid, myristic acid, palmitic acid, margaric acid, stearic acid, oleic acid, linoleic acid, linolenic acid, arachidonic acid, docosahexaenoic acid, eicosapentaenoic acid, lactic acid, malic acid, citric acid, benzoic acid, phthalic acid, isophthalic acid, terephthalic acid, salicylic acid, gallic acid, mellitic acid, cinnamic acid, oxalic acid, malonic acid, succinic acid, glutaric acid, adipic acid, fumaric acid, maleic acid, aconitic acid, amino acids, anthranilic acid, nitrocarboxylic acid and the like; sulfonic acids such as methanesulfonic acid, ethanesulfonic acid, benzenesulfonic acid, p-toluenesulfonic acid, 10-camphorsulfonic acid, isethionic acid, taurine and the like; inorganic acids such as carbonic acid, hydrochloric acid, nitric acid, phosphoric acid, hypophosphorous acid, phosphorous acid, phosphonic acid, sulfuric acid, boric acid, hydrofluoric acid, orthophosphoric acid, pyrophosphoric acid, polyphosphoric acid, metaphosphoric acid, hexametaphosphoric acid and the like; hydroxides of alkali metals such as potassium hydroxide (KOH) and the like; hydroxides of Group 2 elements; ammonia; organic bases such as quaternary ammonium hydroxide and the like; amines such as aliphatic amines, aromatic amines and the like; chelating agents such as N-methyl-D-glucamine, D-glucamine, N-ethyl-D-glucamine, N-propyl-D-glucamine, N-octyl-D-glucamine, N-acetyl-D-glucosamine, tris(hydroxymethyl)aminomethane, bis(2-hydroxyethyl)aminotris(hydroxymethyl)methane, iminodiacetic acid, N-(2-acetamido)iminodiacetic acid, hydroxyethyliminodiacetic acid, N,N-di(2-hydroxyethyl)glycine, N-[tris (hydroxymethyl)methyl]glycine, nitrilotriacetic acid, diethylenetriaminepentaacetic acid, ethylenediaminetetraacetic acid, N,N,N-trimethylenephosphonic acid, ethylenediamine-N,N,N',N'-tetramethylenesulfonic acid, transcyclohexanediaminetetraacetic acid, 1,2-diaminopropane tetraacetic acid, glycol ether diaminetetraacetic acid, ethylenediamineorthohydroxyphenylacetic acid, ethylenediaminedisuccinic acid (SS form), N-(2-carboxylate ethyl)-L-aspartic acid, β-alanine diacetic acid, phosphonobutanetricarboxylic acid (2-phosphonobutane-1,2,4-tricarboxylic acid), hydroxyethylidene diphosphonic acid (HEDP) (1-hydroxyethylidene-1,1-diphosphonic acid), nitrilotris(methylenephosphonic acid), N,N'-bis(2-hydroxybenzyl)ethylenediamine-N,N'-diacetic acid, 1,2-dihydroxybenzene-4,6-disulfonic acid, polyamine, polyphosphonic acid, polyaminocarboxylic acid, polyaminophosphonic acid and the like, or salts thereof, and the like. These pH adjusting agents may be used singly or two or more kinds thereof may be used in combination.

Among these pH adjusting agents, citric acid, phosphoric acid or maleic acid is more preferable, citric acid or maleic acid is still more preferable, and maleic acid is particularly preferable.

As the content of the pH adjusting agent in the polishing composition, an amount may be appropriately selected so as to have a desired pH value of the polishing composition and it is preferable to add the pH adjusting agent in an amount so as to have a preferred pH value of the polishing composition to be described later.

In addition, among pH adjusting agents, there are also ones that are a pH adjusting agent and also function as a polishing accelerator to be described below.

(Polishing Accelerator)

It is preferable that the polishing composition according to an aspect of the present invention further contains a polishing accelerator in order to further improve the polishing speed. In the present specification, the polishing accelerator is the pH adjusting agent described above and refers to a compound capable of improving the polishing speed by the action of a compound other than the pH adjustment.

The polishing speed can be improved by adding a polishing accelerator. Moreover, even in a case in which the pH value of the polishing composition is larger and the positive charge on the surface of the object to be polished is lower, it is possible to realize a high polishing speed of the object to be polished using abrasive grains of which the surface is negatively charged (for example, silica in which an organic acid is immobilized on the surface) by adding a polishing accelerator.

The polishing accelerator is not particularly limited, and examples thereof include N-methyl-D-glucamine, D-glucamine, N-ethyl-D-glucamine, N-propyl-D-glucamine, N-octyl-D-glucamine, N-acetyl-D-glucosamine, tris(hydroxymethyl)aminomethane, bis(2-hydroxyethyl)aminotris (hydroxymethyl)methane, N-(2-acetamido)iminodiacetic acid, N,N-di(2-hydroxyethyl)glycine, N-[tris (hydroxymethyl)methyl]glycine, hydroxyethyliminodiacetic acid, iminodiacetic acid, hydroxyethylidene diphosphonic acid (HEDP), nitrilotris(methylene phosphonic acid), phosphonobutanetricarboxylic acid, and salts thereof and the like. These polishing accelerators may be used singly or two or more kinds thereof may be used in mixture.

Among these polishing accelerators, it is more preferable to use iminodiacetic acid or N-methyl-D-glucamine and it is still more preferable to use N-methyl-D-glucamine.

The lower limit of the content of the polishing accelerator in the polishing composition is preferably 0.01 g/L or more, more preferably 0.1 g/L or more, still more preferably 1 g/L or more, and particularly preferably 2 g/L or more. In addition, the upper limit of the content of the polishing accelerator in the polishing composition is preferably 100 g/L or less, more preferably 50 g/L or less, still more preferably 20 g/L or less, and particularly preferably 10 g/L or less.

If the content is in such a range, it is possible to more favorably exert the effects of the polishing accelerator.

(Other Additives)

The polishing composition according to an aspect of the present invention may further contain other additives such as a complexing agent, a metal anticorrosive, an antiseptic agent, an antifungal agent, an oxidizing agent, a reducing agent, a surfactant, a water-soluble polymer (indicating a water-soluble polymer other than a compound having an oxyalkylene group in the present specification) and the like, if necessary. The complexing agent, the metal anticorrosive, the antiseptic agent, the antifungal agent, the oxidizing agent, the reducing agent, the surfactant, and the water-soluble polymer are not particularly limited, and known ones used in the field of polishing composition can be used as each of these.

(Dispersing Medium)

The polishing composition according to an aspect of the present invention contains a dispersing medium.

The polishing composition of the present invention preferably contains water as a dispersing medium. It is preferable to use highly pure water as far as possible from the viewpoint of preventing the influence of impurities on other components of the polishing composition. Specifically, pure water, ultrapure water, or distilled water from which impurity ions have been removed using an ion exchange resin and then foreign matters have been removed by allowing the water to pass through a filter. In addition, as the dispersing medium, an organic solvent and the like may be further contained for the purpose of controlling the dispersibility of other components of the polishing composition, and the like.

(pH Value)

The polishing composition according to an aspect of the present invention has a pH of less than 7.

When the pH value is 7 or more, the positive charge on the surface of the object to be polished is lower and it is difficult to polish the object to be polished at a high speed using abrasive grains of which the surface is negatively charged (for example, silica in which an organic acid is immobilized on the surface).

The upper limit of the pH value of the polishing composition is preferably 5 or less, more preferably 4 or less, and particularly preferably 3 or less from the viewpoint of polishing the object to be polished by the polishing composition at a sufficient polishing speed. The lower limit of the pH value of the polishing composition is preferably 1 or more and more preferably 1.5 or more from the viewpoint of safety. Moreover, the lower limit is still more preferably 2 or more from the viewpoint of further decreasing the level difference to be unintentionally generated between dissimilar materials and the level difference to be unintentionally generated between coarse and dense portions of the pattern.

(Object to be Polished)

The object to be polished to which the polishing composition according to an aspect of the present invention, the polishing method according to another aspect of the present invention to be described later, and the method for manufacturing a substrate according to still another aspect of the present invention are applied is not particularly limited, and these can be applied to known objects to be polished used in the field of CMP. Examples of the object to be polished include metals, objects to be polished having a silicon-oxygen bond, objects to be polished having a silicon-silicon bond, objects to be polished having a silicon-nitrogen bond and the like.

The object to be polished is preferably an object to be polished containing two or more kinds of materials and more preferably an object to be polished containing (a) a material having a silicon-nitrogen bond and (b) another material containing silicon.

(a) Material Having Silicon-Nitrogen Bond

The material having a silicon-nitrogen bond is not particularly limited, and examples thereof include silicon nitride (SiN), silicon carbonitride (SiCN) and the like.

(b) Another Material Containing Silicon

Another material containing silicon is not particularly limited as long as it is a material containing silicon other than the material having a silicon-nitrogen bond, and examples thereof include those as to be described below.

(b-1) Material Having Silicon-Oxygen Bond

The material having a silicon-oxygen bond is not particularly limited, but examples thereof include silicon oxide such as TEOS, BD (black diamond: SiOCH), FSG (fluorosilicate glass), HSQ (hydrogen silsesquioxane), CYCLOTENE, SiLK, MSQ (methyl silsesquioxane) and the like.

(b-2) Material Having Silicon-Silicon Bond

The object to be polished having a silicon-silicon bond is not particularly limited, but examples thereof include polysilicon, amorphous silicon, single crystal silicon, n-type doped single crystal silicon, p-type doped single crystal silicon, Si-based alloys such as SiGe and the like, and the like.

Incidentally, the object to be polished containing (a) a material having a silicon-nitrogen bond and (b) another material containing silicon may contain other materials if necessary. The other materials are not particularly limited, and examples thereof include a metal and the like. The metal is not particularly limited, and examples thereof include copper, aluminum, hafnium, cobalt, nickel, titanium, tungsten and the like.

Among these, the object to be polished is particularly preferably an object to be polished containing (a) silicon nitride and (b) silicon oxide or polysilicon and most preferably an object to be polished containing (a) silicon nitride and (b) silicon oxide.

Here, in the polishing composition according to an aspect of the present invention, the lower limit of the ratio of the polishing speed (Å/min) of silicon nitride to the polishing speed (Å/min) of silicon oxide is preferably 30 or more. In addition, the upper limit of the ratio of the polishing speed (Å/min) of silicon nitride to the polishing speed (Å/min) of silicon oxide is preferably 100 or less and more preferably 85 or less.

Incidentally, the object to be polished is preferably a substrate, more preferably a semiconductor substrate, and still more preferably a patterned wafer as a product mode.

<Method for Producing Polishing Composition>

Another aspect of the present invention is a method for producing the polishing composition according to an aspect of the present invention including mixing abrasive grains having an average primary particle size of 5 to 50 nm, a level difference modifier, and a dispersing medium. At this time, various kinds of additives which can be arbitrarily used if necessary may be further mixed by stirring. The details of the various kinds of additives to be added are as described above.

In the present specification, mixing of the level difference modifier includes mixing of a compound represented by Chemical Formula (1) above or a salt thereof, a compound represented by Chemical Formula (2) above or a salt thereof, a polymer composed of a structural unit represented by Chemical Formula (3) above or a salt thereof, or a copolymer having a structural unit represented by Chemical Formula (3) above and a structural unit derived from another monomer or a salt thereof in the state of itself and mixing of hydrates of these.

Among these, the method for producing a polishing composition according to an aspect of the present invention, which includes mixing an abrasive grain having an average primary particle size of 5 to 50 nm, a level difference modifier, and a dispersing medium and adjusting the pH to less than 7 is preferable.

Incidentally, in the case of using a pH adjusting agent, the step of adding the pH adjusting agent can be "adjustment of the pH to less than 7" in the production method according to an aspect of the present invention. In addition, adjustment to other preferred pH ranges is also the same. However, the method for adjusting the pH is not limited to this.

The temperature when the respective components are mixed together is not particularly limited but is preferably 10° C. to 40° C., and heating may be performed in order to increase the rate of dissolution.

<Polishing Method>

Still another aspect of the present invention is a polishing method, which includes polishing an object to be polished by the polishing composition according to an aspect of the present invention.

Moreover, yet still another aspect of the present invention is a method for manufacturing a substrate, which includes polishing an object to be polished by the polishing method according to an aspect of the present invention.

When an object to be polished is polished by the polishing composition according to an aspect of the present invention, the polishing can be performed using an apparatus and conditions used for normal polishing. As a general polishing apparatus, there are a single-side polishing apparatus and a double-side polishing apparatus. By a single-side polishing apparatus, one side of the material to be polished is polished by holding the substrate using a holder called a carrier and pressing the table having the polishing pad stuck to the opposite surface of the substrate and rotating the table while supplying the polishing composition from above. At this time, polishing is performed by the physical action by the friction of the polishing pad and the polishing composition with the object to be polished and the chemical action of the polishing composition caused to the object to be polished.

As the polishing pad, porous materials such as non-woven fabric, polyurethane, suede and the like can be used without particular limitation. It is preferable that the polishing pad has been subjected to machining so as to retain the polishing liquid.

The polishing conditions in the polishing method according to the present invention include the polishing load, the revolution number of table, the revolution number of carrier, the flow rate of polishing composition, and the polishing time. There is no particular limitation on these polishing conditions, but for example, the polishing load is preferably 0.1 psi or more and 10 psi or less, more preferably 0.5 psi or more and 8 psi or less, and still more preferably 1 psi or more and 6 psi or less per unit area of the substrate. Generally, as the load is higher, the frictional force by the abrasive grains is higher and the mechanical machining force is enhanced, and thus the polishing speed increases. If the polishing load is in this range, a sufficient polishing speed is exerted and it is possible to suppress breakage of the substrate due to the load and the generation of defects such as scratches and the like on the surface. The revolution number of table and the revolution number of carrier are preferably 10 rpm or more and 500 rpm or less, more preferably 20 rpm or more and 300 rpm or less, and still more preferably 30 rpm or more and 200 rpm or less. The amount of the polishing composition supplied (the flow rate of the polishing composition) may be any supplied amount as long as the entire object to be polished is covered, may be adjusted depending on the conditions such as the size of the substrate and the like, and is not particularly limited, but can be set to, for example, 100 mL/min or more and 5000 mL/min or less, and the like. The polishing time can be appropriately set so as to achieve the target polishing result, but is preferably, for example, 5 seconds or more and 180 seconds or less.

The polishing composition of the present invention may be a one-pact type or a multi-pack type including a two-pact type. In addition, the polishing composition of the present invention may be adjusted by diluting a stock solution of the polishing composition, for example, 10-fold or more using a diluent such as water or the like.

Examples

The present invention will be described in more detail with reference to the following Examples and Comparative Examples. However, the technical scope of the present invention is not limited only to the following Examples.

<Preparation of Polishing Composition Nos. 1 to 26>

The abrasive grains, level difference modifier, and, if necessary, polyoxyalkylene group-containing compound and other additives presented in Table 1 were added to water as a solvent so as to have the concentrations and contents presented in Table 1 and mixed with the water by stirring, thereby obtaining a polishing composition (mixing temperature: about 25° C., mixing time: about 10 minutes). Here, the pH of the polishing composition was adjusted using the pH adjusting agents presented in Table 1, and the pH was confirmed using a pH meter (model number: LAQUA (registered trademark) manufactured by HORIBA, Ltd.).

Incidentally, the details of the respective abrasive grains, the respective level difference modifiers, and other additives in the table are as follows. In addition, PEG in the table denotes polyethylene glycol, PPG denotes polypropylene glycol, and POE-MME denotes polyoxyethylene monomethyl ether.

In addition, the amounts of the following compound C and the following compound D added in the state of hydrates were described as the contents thereof in the table.

Moreover, the following compound L was used as a polishing accelerator (also serving as a pH adjusting agent) in the polishing composition Nos. 13 and 14 and two kinds of level difference modifiers were concurrently used in the polishing composition Nos. 25 and 26.

(Abrasive Grain)

Abrasive grain A: colloidal silica in which sulfonic acid is immobilized on surface (average primary particle size: 14 nm, average secondary particle size: 36 nm)

Abrasive grain B: colloidal silica in which sulfonic acid is immobilized on surface (average primary particle size: 32 nm, average secondary particle size: 70 nm)

(Level Difference Modifier and Polishing Accelerator)

Compound C: m-xylenesulfonic acid (addition was performed in the state of m-xylenesulfonic acid dihydrate)

Compound D: sodium 2-naphthol-6-sulfonate (addition was performed in the state of sodium 2-naphthol-6-sulfonate hexahydrate)

Compound E: sodium 1-naphthalenesulfonate

Compound F: p-toluidine-2-sulfonic acid

Compound G: copolymer of para-styrenesulfonic acid and styrene (weight average molecular weight: 20,000, structural unit derived from para-styrenesulfonic acid structural unit derived from styrene=50:50 (molar ratio))

Compound H: copolymer of para-styrenesulfonic acid and styrene (weight average molecular weight: 4,000, structural unit derived from para-styrenesulfonic acid structural unit derived from styrene=90:10 (molar ratio))

Compound I: isethionic acid

Compound J: taurine

Compound K: dodecylbenzenesulfonic acid

Compound L: N-methyl-D-glucamine

Compound M: polyacrylic acid (weight average molecular weight: 20,000)

(Weight Average Molecular Weight)

The measurement conditions of the weight average molecular weights of the compound G, compound H, and compound M, and polyoxyalkylene group-containing compound are as follows.

GPC apparatus: manufactured by Shimadzu Corporation

Model: Prominence+ELSD detector (ELSD-LTII)

Column: VP-ODS (manufactured by Shimadzu Corporation)

Mobile phase A: MeOH

B: 1% aqueous solution of acetic acid

Flow rate: 1 mL/min

Detector: ELSD temp. 40° C., Gain 8, N2GAS 350 kPa

Oven temperature: 40° C.

Injection volume: 40 μL.

<Evaluation on Properties of Polishing Composition>

Subsequently, the properties of the polishing compositions obtained were evaluated.

(Polishing Speed of Silicon Oxide (TEOS) and Silicon Nitride)

The polishing speed was evaluated by determining the film thickness of the respective 200 mm wafers of silicon nitride (SiN) and TEOS before and after being polished using a light interference type film thickness measurement apparatus and dividing the difference in film thickness by the polishing time. Here, the polishing conditions are as follows.

[Polishing condition]
Polishing machine: CMP single-side polishing machine for 200 mm wafer
Pad: polyurethane pad
Pressure: 3.2 psi (about 22.1 kPa)
Revolution number of table: 90 rpm
Flow rate of polishing composition: 130 mL/min
Polishing time: 1 minute
Object to be polished: 200 mm wafer (SiN, TEOS)
SiN: manufactured by low pressure chemical vapor deposition (LPCVD), thickness: 3500 Å
TEOS: manufactured by physical vapor deposition (PVD) (hereinafter, TEOS manufactured by PVD is also referred to as P-TEOS), thickness: 10000 Å

(Amount of level difference alleviated)

With regard to the amount of level difference alleviated, an 8-inch SiN/P-TEOS patterned wafer having the following configuration was polished, the SiN layer at the convex portion of the pattern was scraped off until the P-TEOS layer was exposed, and thus a patterned surface consisting of P-TEOS and SiN was formed on the wafer. Here, the polishing conditions were the same as the conditions used for the polishing speed of TEOS and SiN described above except that the object to be polished was changed to an 8-inch SiN/P-TEOS patterned wafer to be presented below and the polishing time was changed. Subsequently, with regard to the patterned surface obtained, the height X (Å) of the level difference between the P-TEOS portion and the adjacent SiN portion at the portion at which the line and space is 1 μm/1 μm was measured by taking the P-TEOS portion as a reference height using AFM (atomic force microscope) (AFM WA1300 manufactured by Hitachi Construction Machinery Co., Ltd.). Thereafter, the amount of level difference alleviated was calculated as a difference obtained by subtracting X (Å) from the difference 600 (Å) of the SiN layer before being polished.

Incidentally, X (Å) is measured by taking the height of the P-TEOS portion at the time of exposure of the P-TEOS layer as the reference, and thus the height of the SiN portion on the pattern is always equal to or less than the height of the P-TEOS portion and X is always a positive value. In addition, it is more desirable as the level difference is smaller and thus it is more preferable as the amount of level difference alleviated is closer to 600 (Å). The specific numerical value is preferably 300 (Å) or more and more preferably 340 (Å) or more although it depends on the polishing conditions as well.

[8-Inch SiN/P-TEOS patterned wafer]
Specification
First layer: SiN thickness: 700 Å (having pattern, pattern corresponding to first layer, level difference: 600 Å)
Second layer: P-TEOS thickness: 1000 Å (having pattern, level difference: 600 Å)
Third layer: Bare-Si.
Incidentally, among the above, the first layer corresponds to the polishing surface side.

(Amount of TEOS Excessively Polished (Ox Loss))

An 8-inch SiN/P-TEOS patterned wafer was polished under the same polishing conditions as in the evaluation of the amount of level difference alleviated except that the polishing was continuously performed for further 25 seconds from the time point of the exposure of P-TEOS layer at the convex portion of pattern, and thus a patterned surface consisting of P-TEOS and SiN was formed on the wafer.

Subsequently, with regard to the portion at which the line and space of the patterned surface obtained was 0.25 μm/0.25 μm in the 8-inch SiN/P-TEOS patterned wafer after being polished, the level difference Y (Å) between the concave portion of the pattern of the P-TEOS layer at the portion at which the SiN layer was not originally layered on the wafer and the P-TEOS layer portion (convex portion of the pattern of the P-TEOS layer) exposed as a result of the removal of SiN layer after polishing was measured using AFM (atomic force microscope) (AFM WA1300 manufactured by Hitachi Construction Machinery Co., Ltd.). Thereafter, the amount of P-TEOS layer excessively polished (amount of TEOS excessively polished) was calculated as 600 (Å) of the level difference of the P-TEOS layer before polishing—Y (Å).

Incidentally, the fact that the amount of TEOS excessively polished is large becomes a cause of the generation of level difference between the coarse and dense portions of the pattern.

The measurement results of the polishing speed, amount of level difference alleviated, and amount of TEOS excessively polished are presented in the following Table 2.

TABLE 1-1

(Prescription of each polishing composition)

| No. | pH | Abrasive grains Kind | Abrasive grains Concentration (mass %) | Level difference modifier Kind | Level difference modifier Content (g/L) | Polyoxyalkylene group-containing compound 1 Kind | Polyoxyalkylene group-containing compound 1 Mw | Polyoxyalkylene group-containing compound 1 Content (g/L) | Polyoxyalkylene group-containing compound 2 Kind | Polyoxyalkylene group-containing compound 2 Mw | Polyoxyalkylene group-containing compound 2 Content (g/L) | Polishing accelerator Kind | Polishing accelerator Content (g/L) | pH adjusting agent | |
|---|---|---|---|---|---|---|---|---|---|---|---|---|---|---|---|
| 1 | 1.5 | A | 1 | Nil | 0 | PEG | 600 | 0.4 | PEG | 200 | 0.2 | Nil | 0 | Phosphoric acid | Comparative Example |
| 2 | 2.5 | A | 1 | Nil | 0 | PEG | 600 | 0.4 | PEG | 200 | 0.2 | Nil | 0 | Citric acid | Comparative Example |
| 3 | 2.5 | A | 1 | C | 1 | PEG | 600 | 0.4 | PEG | 200 | 0.2 | Nil | 0 | Citric acid | Example |
| 4 | 2.5 | A | 1 | C | 1 | PEG | 600 | 0.4 | Nil | | 0 | Nil | 0 | Citric acid | Example |
| 5 | 2.5 | A | 1 | C | 1 | Nil | | 0 | PEG | 200 | 0.2 | Nil | 0 | Citric acid | Example |
| 6 | 2.5 | A | 1 | C | 1 | Nil | | 0 | Nil | | 0 | Nil | 0 | Citric acid | Example |
| 7 | 2.5 | A | 1 | D | 1 | PPG | 600 | 0.4 | PPG | 200 | 0.2 | Nil | 0 | Citric acid | Example |
| 8 | 2.5 | B | 0.3 | D | 1 | PEG | 600 | 0.4 | PEG | 200 | 0.2 | Nil | 0 | Citric acid | Example |
| 9 | 2.5 | A | 0.5 | D | 1 | PEG | 600 | 0.4 | PEG | 200 | 0.2 | Nil | 0 | Citric acid | Example |
| 10 | 2.5 | A | 1 | E | 1 | PEG | 600 | 0.4 | PEG | 200 | 0.2 | Nil | 0 | Citric acid | Example |
| 11 | 2.5 | A | 1 | D | 1 | PEG | 600 | 0.4 | PEG | 200 | 0.2 | Nil | 0 | Citric acid | Example |
| 12 | 2.5 | A | 1 | F | 1 | PEG | 600 | 0.4 | PEG | 200 | 0.2 | Nil | 0 | Citric acid | Example |
| 13 | 4 | A | 3 | C | 1 | PEG | 600 | 0.4 | PEG | 200 | 0.2 | L | 2.5 | Maleic acid | Example |

TABLE 1-1-continued (Prescription of each polishing composition)

| | | Abrasive grains | | Level difference modifier | | Polyoxyalkylene group-containing compound 1 | | | Polyoxyalkylene group-containing compound 2 | | | Polishing accelerator | | pH adjusting agent | |
|---|---|---|---|---|---|---|---|---|---|---|---|---|---|---|---|
| No. | pH | Kind | Concentration (mass %) | Kind | Content (g/L) | Kind | Mw | Content (g/L) | Kind | Mw | Content (g/L) | Kind | Content (g/L) | | |
| 14 | 4 | A | 3 | C | 3 | PEG | 600 | 0.4 | PEG | 200 | 0.2 | L | 2.5 | Compound L Maleic acid | Example |
| 15 | 1.5 | A | 3 | C | 3 | PEG | 600 | 0.4 | PEG | 200 | 0.2 | Nil | 0 | Compound L Phosphoric acid | Example |
| 16 | 2.5 | A | 1 | G | 0.005 | PEG | 600 | 0.4 | PEG | 200 | 0.2 | Nil | 0 | Citric acid | Example |
| 17 | 2.5 | A | 1 | G | 0.01 | PEG | 600 | 0.4 | PEG | 200 | 0.2 | Nil | 0 | Citric acid | Example |
| 18 | 2.5 | A | 1 | H | 0.005 | PEG | 600 | 0.4 | PEG | 200 | 0.2 | Nil | 0 | Citric acid | Example |

(Note 1)
The kind and content of polishing accelerators in the polishing composition No. 22 indicate the kind and content of polishing accelerators other than the compound L.

TABLE 1-2

(Prescription of each polishing composition)

| | | Abrasive grains | | Level difference modifier | | Polyoxyalkylene group-containing compound 1 | | | Polyoxyalkylene group-containing compound 2 | | | Polishing accelerator | | pH adjusting agent | |
|---|---|---|---|---|---|---|---|---|---|---|---|---|---|---|---|
| No. | pH | Kind | Concentration (mass %) | Kind | Content (g/L) | Kind | Mw | Content (g/L) | Kind | Mw | Content (g/L) | Kind | Content (g/L) | | |
| 19 | 2.5 | A | 1 | I | 1 | PEG | 600 | 0.4 | PEG | 200 | 0.2 | Nil | 0 | Citric acid | Comparative Example |
| 20 | 2.5 | A | 1 | J | 1 | PEG | 600 | 0.4 | PEG | 200 | 0.2 | Nil | 0 | Citric acid | Comparative Example |
| 21 | 2.5 | A | 1 | K | 1 | PEG | 600 | 0.4 | PEG | 200 | 0.2 | Nil | 0 | Citric acid | Comparative Example |
| 22 | 2.5 | A | 1 | L | 2.5 | PEG | 600 | 0.4 | PEG | 200 | 0.2 | Nil (Note 1) | 0 (Note 1) | Citric acid Compound L | Comparative Example |
| 23 | 2.5 | A | 1 | M | 0.005 | PEG | 600 | 0.4 | PEG | 200 | 0.2 | Nil | 0 | Citric acid | Comparative Example |
| 24 | 2.5 | B | 0.3 | Nil | 0 | PEG | 600 | 0.4 | PEG | 200 | 0.2 | Nil | 0 | Citric acid | Comparative Example |
| 25 | 2.5 | A | 1 | H F | 0.005 1 | PEG | 600 | 0.4 | PEG | 200 | 0.2 | Nil | 0 | Citric acid | Example |
| 26 | 2.5 | A | 1 | H F | 0.005 1 | PDE-MME | 550 | 0.4 | Nil | | 0 | Nil | 0 | Citric acid | Example |

(Note 1)
The kind and content of polishing accelerators in the polishing composition No. 22 indicate the kind and content of polishing accelerators other than the compound L.

TABLE 2

(Evaluation results of each polishing composition)

| | Polishing speed (Å/min) | | Ratio of polishing speed | Amount of level difference | Amount of TEOS excessively | |
|---|---|---|---|---|---|---|
| No. | TEOS | SiN | SiN/TEOS | alleviated (Å) | polished (Å) | |
| 1 | 31 | 693 | 22 | 263 | 150 | Comparative Example |
| 2 | 12 | 619 | 50 | 324 | 130 | Comparative Example |
| 3 | 11 | 627 | 58 | 368 | 100 | Example |
| 4 | 11 | 624 | 58 | 360 | 100 | Example |
| 5 | 11 | 628 | 59 | 358 | 105 | Example |
| 6 | 12 | 628 | 52 | 355 | 110 | Example |
| 7 | 10 | 600 | 60 | 375 | 90 | Example |
| 8 | 7 | 505 | 72 | 300 | 120 | Example |

TABLE 2-continued (Evaluation results of each polishing composition)

| No. | Polishing speed(Å/min) TEOS | Polishing speed(Å/min) SiN | Ratio of polishing speed SiN/TEOS | Amount of level difference alleviated (Å) | Amount of TEOS excessively polished (Å) | |
|---|---|---|---|---|---|---|
| 9 | 8 | 552 | 69 | 370 | 70 | Example |
| 10 | 11 | 600 | 54 | 372 | 90 | Example |
| 11 | 11 | 612 | 57 | 370 | 93 | Example |
| 12 | 16 | 622 | 38 | 360 | 107 | Example |
| 13 | 8 | 639 | 83 | 350 | 70 | Example |
| 14 | 6 | 600 | 100 | 373 | 47 | Example |
| 15 | 18 | 680 | 38 | 300 | 120 | Example |
| 16 | 13 | 630 | 49 | 377 | 50 | Example |
| 17 | 9 | 570 | 63 | 380 | 48 | Example |
| 18 | 10 | 490 | 49 | 360 | 70 | Example |
| 19 | 16 | 601 | 37 | 300 | 140 | Comparative Example |
| 20 | 14 | 621 | 44 | 320 | 135 | Comparative Example |
| 21 | 10 | 60 | 6 | Unevaluable | Unevaluable | Comparative Example |
| 22 | 18 | 620 | 34 | 300 | 150 | Comparative Example |
| 23 | 13 | 540 | 42 | 320 | 130 | Comparative Example |
| 24 | 8 | 509 | 64 | 260 | 170 | Comparative Example |
| 25 | 7 | 595 | 85 | 380 | 47 | Example |
| 26 | 6 | 596 | 99 | 385 | 45 | Example |

As presented in Tables 1 and 2, it has been confirmed that the polishing composition Nos. 3 to 18, 25, and 26 according to an aspect of the present invention exhibit excellent results that the amount of TEOS excessively polished is smaller in the polishing of a patterned wafer as compared to the polishing composition Nos. 1, 2 and 19 to 24 which are out of the scope of the present invention. Moreover, the polishing composition Nos. 3 to 18, 25, and 26 according to an aspect of the present invention also exhibit a favorable amount of level difference alleviated of 300 Å or more in addition to this effect that the amount of TEOS excessively polished is small.

Incidentally, in the polishing composition No. 21, the polishing speed of SiN was low and the ratio of polishing speed between SiN and TEOS was small, it was thus difficult to expose the P-TEOS layer at the convex portion of the pattern and to determine the time point of the exposure of P-TEOS layer, and it was not possible to correctly evaluate the measurement of the amount of level difference alleviated and the amount of TEOS excessively polished.

In the polishing composition No. 21, a compound K having an aromatic ring and a sulfo group directly bonded to this aromatic ring was used as a level difference modifier but favorable results were not obtained. The reason for this can be presumed as follows. The compound K is present in the dimerized form at the time of polishing by the action of a structural moiety other than the aromatic ring and the sulfo group directly bonded to this aromatic ring, particularly a long chain hydrocarbon group. Moreover, the compound K is adsorbed to the wafer so that the sulfo group faces both the wafer side and the opposite side (dispersing medium side). At this time, polishing by the abrasive grains is suppressed by the influence of the polarity of the sulfo group facing the wafer side and the opposite side (dispersing medium side), and it is difficult to perform sufficient polishing.

This application is based upon and claims the benefit of priority of the prior Japanese Patent Application No. 2017-048626 filed on Mar. 14, 2017, the entire contents of which are incorporated herein by reference.

The invention claimed is:
1. A polishing composition comprising:
abrasive grains having an average primary particle size of 5 to 25 nm,
at least one kind of level difference modifier selected from the group consisting of m-xylenesulfonic acid, p-toluidine-2-sulfonic acid, a compound represented by the following Formula (2), a polymer or copolymer comprising a structural unit represented by the following Formula (3), and salts thereof:

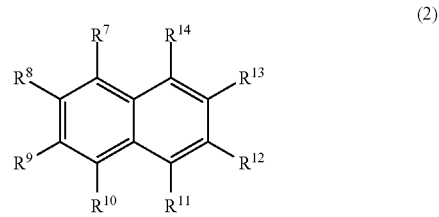

(2)

wherein $R^7$ to $R^{14}$ each independently denote a hydrogen atom, a hydroxy group, a sulfo group, an anionic group which does not have a sulfo group, a cationic group, an alkoxycarbonyl group having 2 to 6 carbon atoms, or a hydrocarbon group having 1 to 10 carbon atoms, and at least one of $R^7$ to $R^{14}$ denotes a sulfo group;

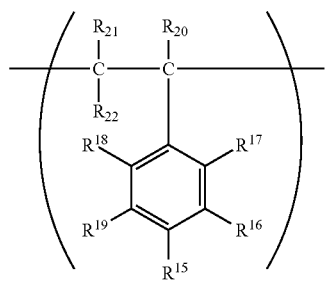

(3)

wherein $R^{15}$ to $R^{19}$ each independently denote a hydrogen atom, a hydroxy group, a sulfo group, an anionic group which does not have a sulfo group, a cationic group, an alkoxycarbonyl group having 2 to 6 carbon atoms, or a hydrocarbon group having 1 to 10 carbon atoms, and at least one of $R^{15}$ to $R^{19}$ denotes a sulfo group, $R^{20}$ to $R^{22}$ each independently denote a hydrogen atom, a hydroxy group, an anionic group which does not have a sulfo group, a cationic group, an alkoxycarbonyl group having 2 to 6 carbon atoms, or a hydrocarbon group having 1 to 10 carbon atoms which is not substituted or may be substituted with a hydroxy group, an anionic group which does not have a sulfo group, a cationic group, or an alkoxycarbonyl group having 2 to 6 carbon atoms;

a polishing accelerator, wherein the polishing accelerator is at least one selected from the group consisting of N-methyl-D-glucamine, D-glucamine, N-ethyl-D-glucamine, N-propyl-D-glucamine, N-octyl-D-glucamine, N-acetyl-D-glucosamine, tris(hydroxymethyl)aminomethane, bis(2-hydroxyethyl)aminotris (hydroxymethyl)methane, N,N-di(2-hydroxyethyl)glycine, hydroxyethyliminodiacetic acid, hydroxyethylidene diphosphonic acid, nitrilotris(methylene phosphonic acid), phosphonobutanetricarboxylic acid, and salts thereof; and a dispersing medium, wherein a pH is 2 or more and less than 7.

2. The polishing composition according to claim 1, wherein the abrasive grain is silica.

3. The polishing composition according to claim 1, further comprising a polyoxyalkylene group-containing compound.

4. The polishing composition according to claim 3, wherein the polyoxyalkylene group-containing compound has at least a first peak and a second peak in molecular weight distribution in terms of polyethylene glycol, by gel permeation chromatography.

5. The polishing composition according to claim 4, wherein:
the polyoxyalkylene group-containing compound comprises a polyoxyalkylene group-containing compound 1 and a polyoxyalkylene group-containing compound 2 that have different weight average molecular weights;
the polyoxyalkylene group-containing compound has two or more peaks in molecular weight distribution in terms of polyethylene glycol, by gel permeation chromatography; and
at least two peaks among the two or more peaks have corresponding molecular weights that are different from each other by 1.5 times or more.

6. The polishing composition according to claim 4, wherein:
the polyoxyalkylene group-containing compound comprises a polyoxyalkylene group-containing compound 1 and a polyoxyalkylene group-containing compound 2 that have different weight average molecular weights;
the weight average molecular weight of the first peak is 100 or more and less than 500; and
the weight average molecular weight of the second peak is 500 or more and 10000 or less.

7. The polishing composition according to claim 3, wherein the polyoxyalkylene group-containing compound is at least one selected from the group consisting of polyethylene glycol, polypropylene glycol, and polybutylene glycol.

8. The polishing composition according to claim 7, wherein:
the polyoxyalkylene group-containing compound comprises a polyoxyalkylene group-containing compound 1 and a polyoxyalkylene group-containing compound 2 that have different weight average molecular weights;
the polyoxyalkylene group-containing compound has two or more peaks in molecular weight distribution in terms of polyethylene glycol, by gel permeation chromatography; and
at least two peaks among the two or more peaks have corresponding molecular weights that are different from each other by 1.5 times or more.

9. The polishing composition according to claim 7, wherein:
the polyoxyalkylene group-containing compound comprises a polyoxyalkylene group-containing compound 1 and a polyoxyalkylene group-containing compound 2 that have different weight average molecular weights;
the polyoxyalkylene group-containing compound has at least a first peak and a second peak in molecular weight distribution in terms of polyethylene glycol, by gel permeation chromatography;
the weight average molecular weight of the first peak is 100 or more and less than 500; and
the weight average molecular weight of the second peak is 500 or more and 10000 or less.

10. The polishing composition according to claim 1, wherein a content of the level difference modifier is 0.001 g/L or more and 5 g/L or less.

11. The polishing composition according to claim 1, wherein the copolymer comprising a structural unit represented by Formula (3) further comprises a structural unit derived from another monomer.

12. The polishing composition according to claim 1, wherein the polishing accelerator is at least one selected from the group consisting of N-methyl-D-glucamine, D-glucamine, N-ethyl-D-glucamine, N-propyl-D-glucamine, N-octyl-D-glucamine, N-acetyl-D-glucosamine, tris(hydroxymethyl)aminomethane, bis(2-hydroxyethyl)aminotris (hydroxymethyl)methane, N,N-di(2-hydroxyethyl)glycine, hydroxyethyliminodiacetic acid, nitrilotris(methylene phosphonic acid), phosphonobutanetricarboxylic acid, and salts thereof.

13. The polishing composition according to claim 1, wherein the abrasive grain is silica in which an organic acid is immobilized on the silica surface.

14. The polishing composition according to claim 1, wherein the polishing accelerator is N-methyl-D-glucamine.

15. The polishing composition according to claim 14, wherein the level difference modifier is at least one selected from the group consisting of m-xylenesulfonic acid, p-toluidine-2-sulfonic acid, 2-naphthol-6-sulfonic acid, 1-naphthalenesulfonic acid, a para-styrenesulfonic acid-styrene copolymer, and salts thereof.

16. The polishing composition according to claim 14, wherein the level difference modifier is at least one selected from the group consisting of m-xylenesulfonic acid, p-toluidine-2-sulfonic acid, and salts thereof.

17. The polishing composition according to claim 14, wherein the level difference modifier is at least one selected from the group consisting of m-xylenesulfonic acid and salts thereof.

18. A method for producing the polishing composition according to claim 1, comprising mixing the abrasive grains having an average primary particle size of 5 to 25 nm, the level difference modifier, the polishing accelerator, and the dispersing medium.

19. A polishing method comprising polishing an object to be polished by the polishing composition according to claim 1.

20. A method for manufacturing a substrate, comprising polishing an object to be polished by the polishing method according to claim 8.

* * * * *